(12) United States Patent
Quaedackers et al.

(10) Patent No.: US 8,685,626 B2
(45) Date of Patent: Apr. 1, 2014

(54) METHOD OF MEASURING A CHARACTERISTIC

(75) Inventors: Johannes Anna Quaedackers, Veldhoven (NL); Paul Christiaan Hinnen, Veldhoven (NL); Antoine Gaston Marie Kiers, Veldhoven (NL); Christian Marinus Leewis, Maastricht (NL)

(73) Assignee: ASML Netherlands B.V., Veldhoven (NL)

( * ) Notice: Subject to any disclaimer, the term of this patent is extended or adjusted under 35 U.S.C. 154(b) by 435 days.

(21) Appl. No.: 12/711,176

(22) Filed: Feb. 23, 2010

(65) Prior Publication Data

US 2010/0227280 A1 Sep. 9, 2010

Related U.S. Application Data

(60) Provisional application No. 61/247,302, filed on Sep. 30, 2009, provisional application No. 61/157,465, filed on Mar. 4, 2009.

(51) Int. Cl.
*G03F 7/26* (2006.01)

(52) U.S. Cl.
USPC .............................. 430/313; 430/311

(58) Field of Classification Search
USPC ........................................ 430/311, 313
See application file for complete search history.

(56) References Cited

U.S. PATENT DOCUMENTS

| 6,337,175 B1 * | 1/2002 | Yamaguchi .................. 430/322 |
| 2008/0064213 A1 * | 3/2008 | Jung ............................. 438/696 |
| 2010/0144153 A1 * | 6/2010 | Sills et al. ..................... 438/696 |

FOREIGN PATENT DOCUMENTS

EP 1 628 164 A 2/2006

* cited by examiner

*Primary Examiner* — Kathleen Duda
(74) *Attorney, Agent, or Firm* — Sterne, Kessler, Goldstein & Fox P.L.L.C.

(57) ABSTRACT

During a multiple patterning process every $n^{th}$ element of the pattern is removed. The removal of the elements of the patterns happens after the pattern has been printed into the radiation sensitive material or etched into substrate. Advantageously, the original mask is not varied, and another exposure step is used to remove the elements of the pattern.

12 Claims, 6 Drawing Sheets

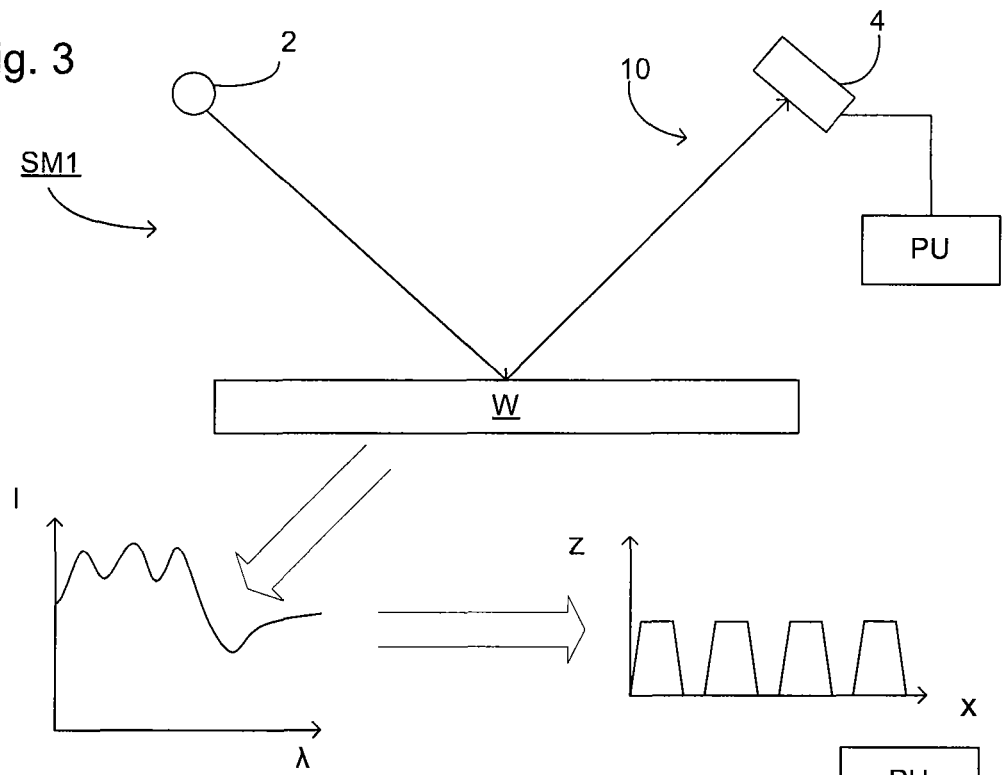
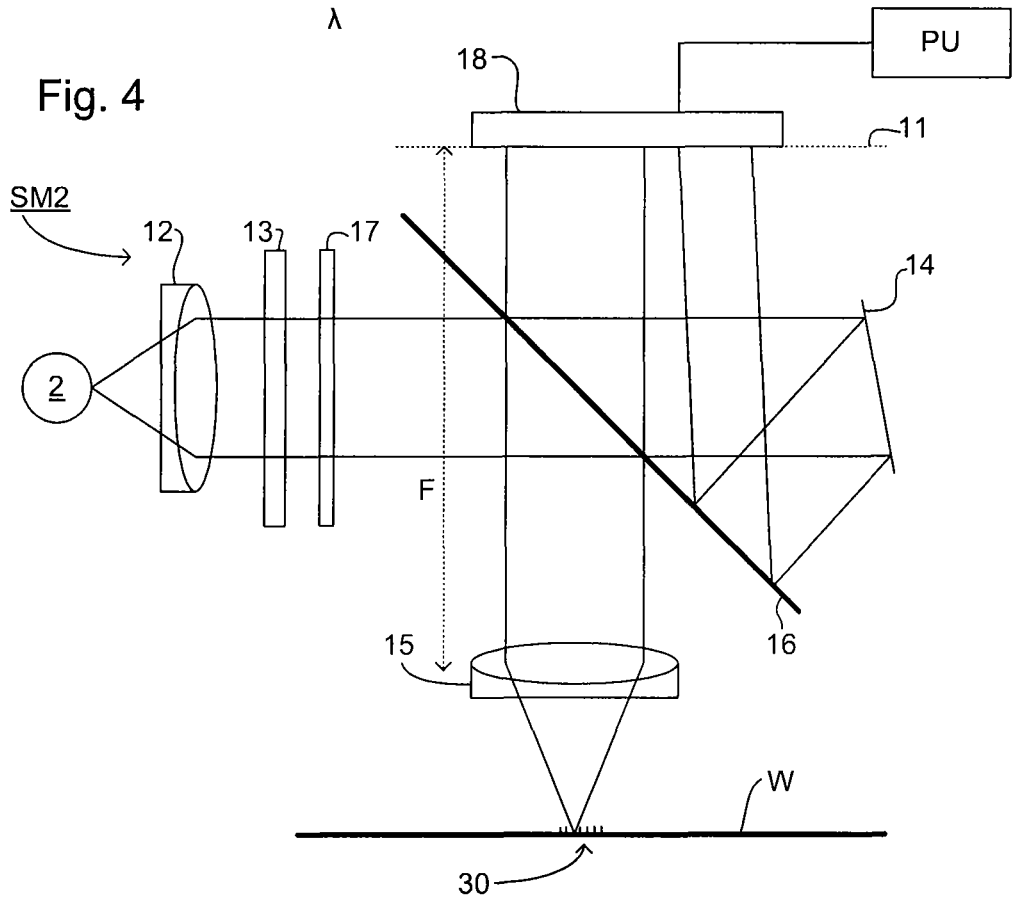

METHOD OF MEASURING A CHARACTERISTIC

CROSS REFERENCE TO RELATED APPLICATION(S)

This application claims priority under 35 U.S.C. §119(e) to U.S. Provisional Patent Application Nos. 61/247,302, filed Sep. 30, 2009, and 61/157,465, filed Mar. 4, 2009, which are both incorporated by reference herein in their entireties.

BACKGROUND

1. Field of the Invention

The present invention relates to a method of determining a characteristic of a substrate.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

The manufacture of IC chip involves the fabrication of many layers. Within each layer multiple, or double, patterning may be used to generate patterns with a smaller critical dimension. There are a number of different methods of achieving double patterning. The first of these is known as lithographic-etch-lithography-etch (LELE) and in this a first pattern is exposed and etched. A second pattern, with features located in the spaces between the features of the first pattern, is then exposed. Next the features of both patterns are etched into the substrate. Thus, a pattern of smaller dimensions than the minimum lithographic pitch can be generated. Another similar double patterning technique is known as lithography-freeze-lithography-etch (LFLE). A pattern is exposed in the resist, which is then "frozen", in fact chemically fixed. A second pattern can then also be exposed in the resist and both patterns are then etched into the substrate. Another double patterning method is known as the spacer method. In the spacer method a sacrificial template is put down and spacers placed either side, and adjacent to, the sacrificial template. The template is then removed and the resulting pattern etched into the substrate.

Using LELE or LFLE there may be some errors, for example in the placement of the features during the second lithography step. Similarly, the features exposed during the first lithography step may not be identical to those exposed during the second lithography step. As there have been two lithography steps the features exposed during each lithography step may be different and need to be assessed separately. However, as the features exposed during the first and second lithography step are, necessarily, very similar and form a regular pattern it can be difficult to distinguish between the two sets of features using angular resolved scatterometry or any other method.

Using the spacer method there may also be imperfections in the pattern, for example in the critical dimension or in the placement of the spacers.

One method to distinguish between the different features is to introduce an anomaly, for example by removing an element of the pattern.

SUMMARY

It is desirable to provide an improved method of introducing an anomaly into the pattern.

According to an aspect of the invention, there is provided a method of measuring a characteristic of a feature of a pattern on a substrate, the method comprising: exposing a repeating pattern in a layer of radiation sensitive material on the substrate; amending an element of the pattern by exposing the element to radiation to generate an amended pattern; transferring the amended pattern to the substrate; projecting a beam of radiation onto the pattern; and measuring the intensity distribution of the reflected radiation beam.

According to a further aspect of the invention there is provided a method of measuring a characteristic of a feature of a pattern on a substrate comprising: exposing a repeating pattern in a layer of resist on the substrate; transferring the pattern into the substrate; amending an element of the pattern; projecting a beam of radiation onto the pattern; and measuring the intensity distribution of the reflected radiation beam.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to allow a person skilled in the relevant art(s) to make and use the invention.

FIG. 3 depicts a first scatterometer, according to an embodiment of the present invention.

FIG. 4 depicts a second scatterometer, according to an embodiment of the present invention.

FIGS. 5A, 5B, 5C, and 5D depict a substrate being processed, according to an embodiment of the invention.

FIGS. 6A, 6B, 6C, and 6D depict a substrate being processed, according to another embodiment of the invention.

Figure 7:
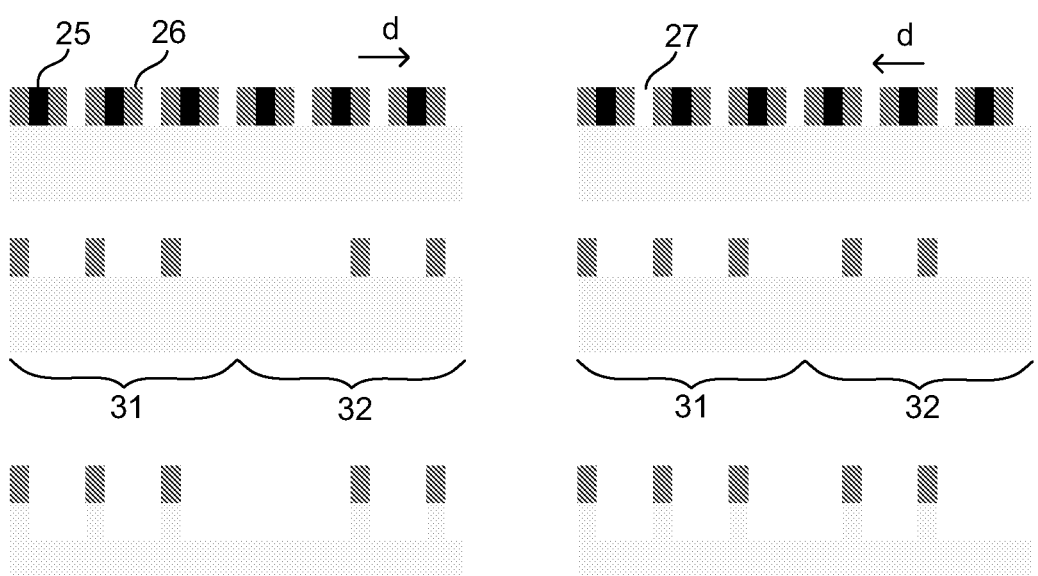

FIG. 7 depicts a third embodiment of the present invention.

Figure 8:
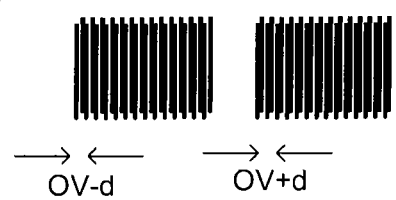

FIG. 8 depicts two pairs of superimposed gratings, according to another embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
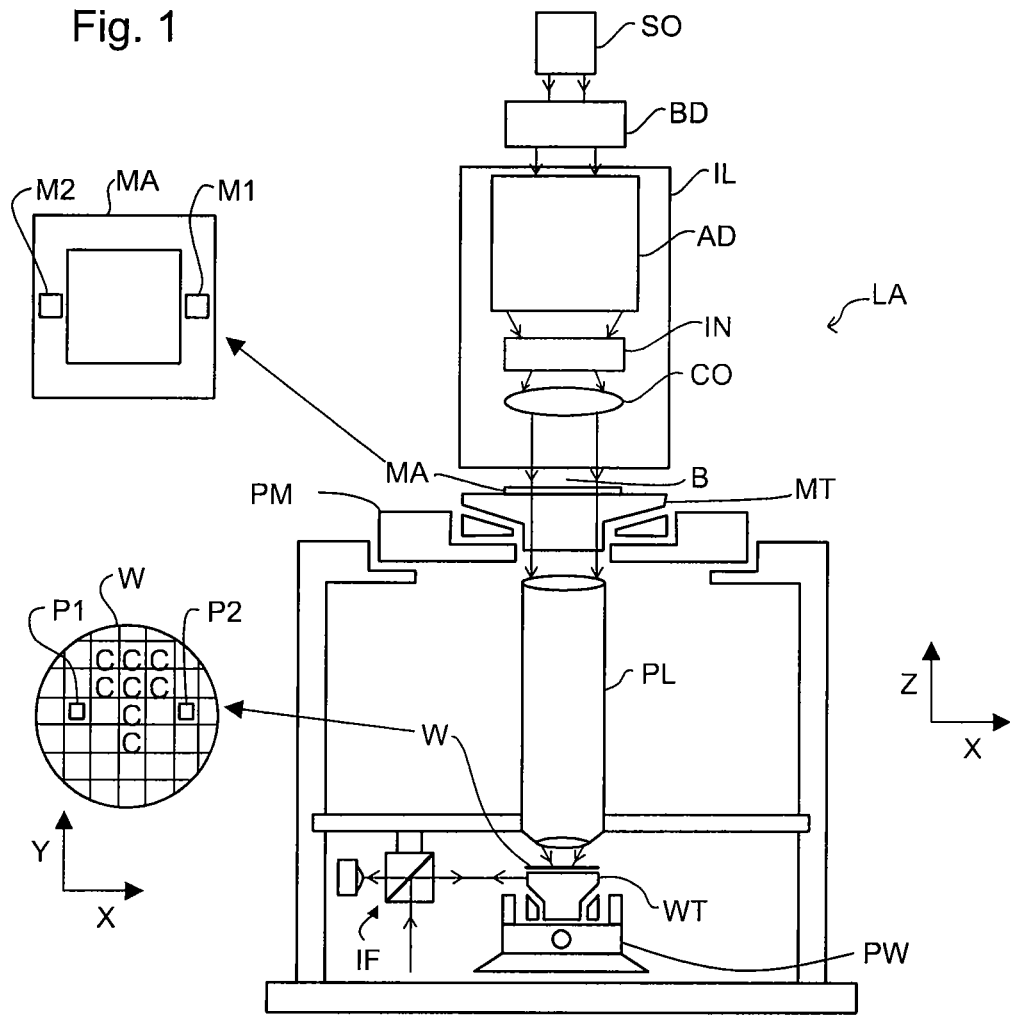
FIG. 1 depicts a lithographic apparatus, according to an embodiment of the present invention.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
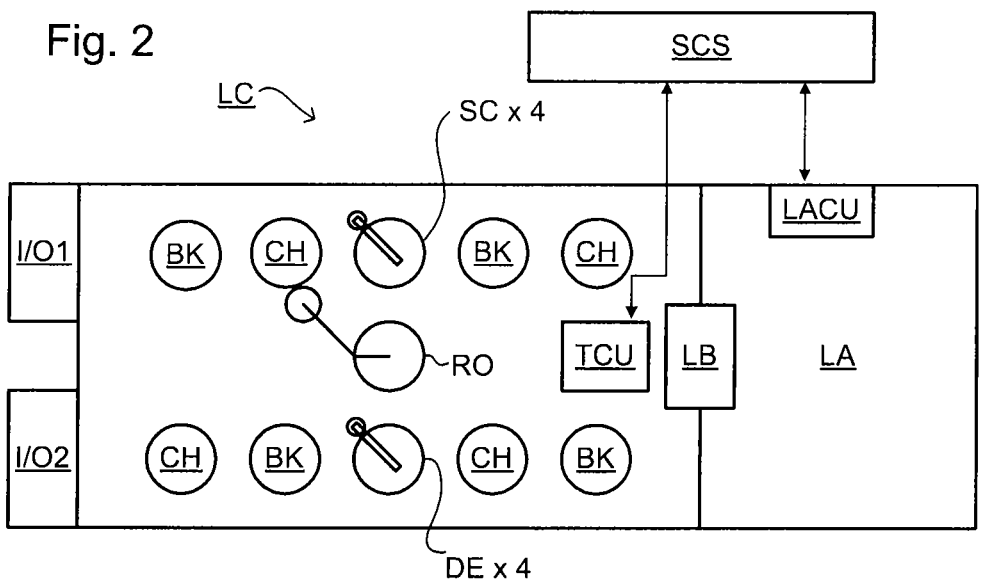
FIG. 2 depicts a lithographic cell or cluster, according to an embodiment of the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions, which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To allow most rapid measurements, it is desirable that the inspection apparatus measure properties in the exposed resist layer immediately after the exposure. However, the latent image in the resist has a very low contrast—there is only a very small difference in refractive index between the parts of the resist, which have been exposed to radiation, and those, which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer that may be used in an embodiment of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1.

The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\lambda$ and a spacing of at least $2\lambda$ (i.e., twice the bandwidth). Several "sources" of radiation can be different portions of an extended radiation source that have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. An example of this is described in more detail in EP1,628,164A, which is incorporated by reference herein in its entirety.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

FIGS. 5A, 5B, 5C, and 5D depict a substrate being processed, according to an embodiment of the invention.

Figure 5A:
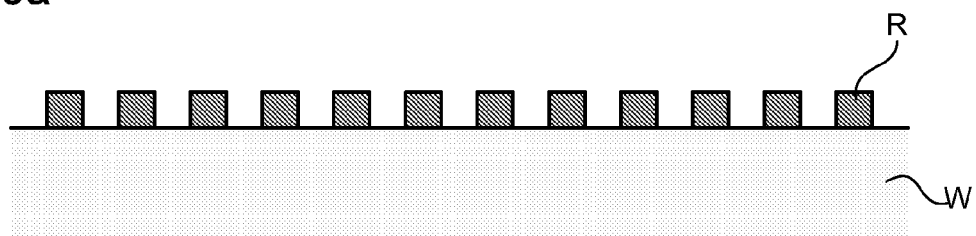
Figure 5B:
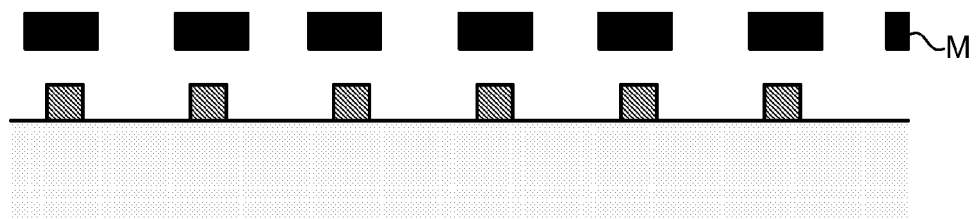
Figure 5C:
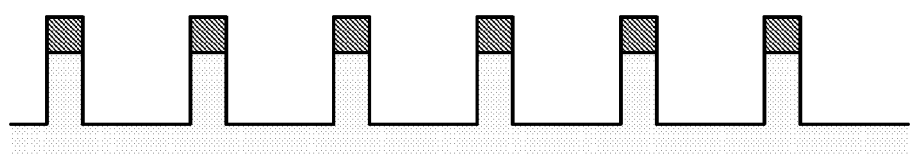
Figure 5D:
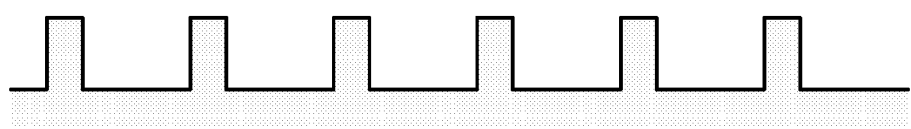
Figure 6A:
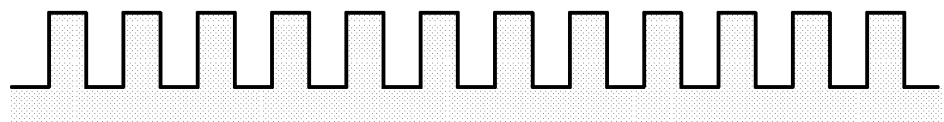
Figure 6B:
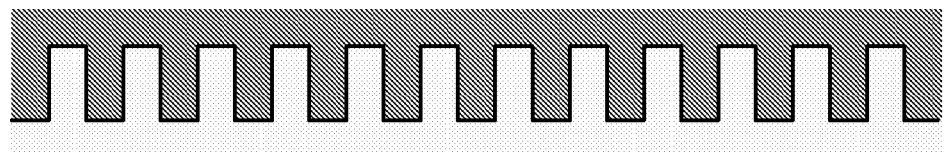
Figure 6C:
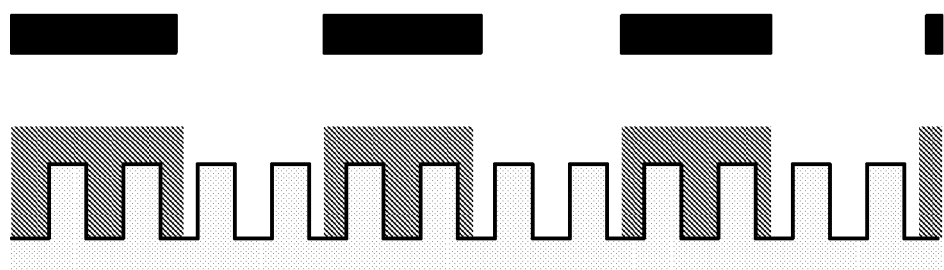
Figure 6D:
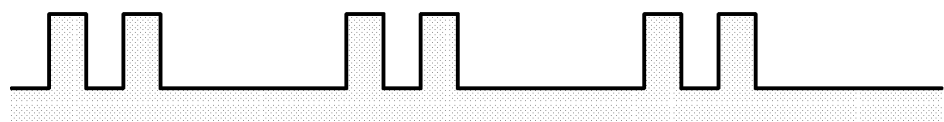

In FIG. 5A, a series of features forming a repeating pattern can be seen in the resist, R, formed on the substrate W. These have been formed by a double patterning technique. This substrate is then subjected to a further exposure. During this exposure, every nth feature is exposed to radiation, which is patterned using a mask, M. In an embodiment n=2, although it may be any integer. The resist material is then developed and the portions of the resist exposed to radiation (namely every nth feature) is consequently removed as shown in FIG. 5B. The pattern is transferred to the substrate e.g., by etching. FIG. 5C depicts the substrate having been etched and the pattern in the substrate itself. The resist is then stripped to reveal a pattern with every nth feature removed. By removing features in this way, it is not necessary to alter the masks and processing windows used in the generation of the original pattern. Furthermore, the additional exposure step can often be included within the usual processing of the substrate, for example during a trim step. Thus, no additional steps would be necessary. In the embodiment depicted here, every other feature has been removed. Thus, in a double patterning technique all the features from one of the exposure steps have been removed. However, in alternative embodiments it may be that every nth feature from one of the exposure patterns is removed.

In the embodiment depicted in FIGS. 5A-5D in another portion of the pattern (formed by the same multiple patterning technique) the other features may instead be removed (thus leaving the features, which have been deleted in FIGS. 5A-5D).

The embodiment described above uses positive radiation sensitive material. However, a negative radiation sensitive material could equally be used although the mask pattern would have to be amended accordingly.

FIGS. 6A, 6B, 6C, and 6D depict a substrate being processed, according to another embodiment of the invention.

FIG. 6 depicts the steps involved in a second embodiment of the invention. In this embodiment features of the repeating pattern are removed after they have been transferred to the substrate, e.g., by etching. This is used, for example, in conjunction with the spacer method of patterning. FIG. 6a depicts a pattern etched into a substrate. The removal of some of the repeating features is, in this embodiment, achieved by applying an additional layer of resist to the substrate as shown in FIG. 6b. A mask which patterns radiation to expose only the resist overlying the portions of the substrate having features to be removed is then used during the exposure of the substrate. When a spacer patterning method is used, every third and fourth feature may be removed, as depicted. The resist material is then developed as shown in FIG. 6c. The substrate is etched and the resist material removed to reveal a pattern with every $n^{th}$ feature removed, as shown in FIG. 6d. For the second embodiment of the invention, a positive or negative resist may be used, although the mask used in the step depicted in FIG. 5c would need to be modified to expose all areas except the areas including the features to be removed.

FIG. 7 depicts a third embodiment of the invention. This is used in conjunction with the spacer method of patterning in which sacrificial templates 25 are put down on the substrate W and spacers 26 placed either side and adjacent to the sacrificial template. The template is then removed and the pattern etched into the substrate. A particular problem with this type of double patterning method is that the size of the spaces in which the templates were located may not be the same size as the non-template spaces 27 between the features. The pupil is relatively insensitive to errors in the spaces (i.e., spaces between features having different sizes).

In the third embodiment, sacrificial templates are placed on the substrate and spacers placed either side of them as depicted in FIG. 7. Two adjacent gratings are usually used, the first depicted on the left hand side of FIG. 7 and the second on the right hand side of FIG. 7. Each grating comprises a plurality of first and second sections. In a first section 31, all of the spaces to the right of the template are removed and in a second section, 32 each of the spacers to the left of the template are removed. As can be seen, the first and second sections are generally separated by an area in which all the spacers have been removed.

As can be seen, the distance between the first and second sections and the distance between the second and first sections is not equal. This generates a bias, d in the pattern. The bias in the patterns on the right hand side of FIG. 7 is equal and opposite to the bias in the patterns on the left hand side of FIG. 7. An introduced bias can be used to determine small errors in the placement of a regular pattern. For example, if each of the patterns is assumed to be a pair of regular superimposed gratings (i.e., the patterns on the left hand side of FIG. 7 form a first pair of superimposed gratings and the patterns on the right hand side of FIG. 7 form a second pair of superimposed gratings) as depicted in FIG. 8, with the first areas 31 forming the features of a first grating and the second areas 32 forming the features of a second grating. The overlay error OV in the gratings (which can be used to determine error in the size of the spaces between features of the patterns) can be determined by measuring the asymmetry A in each of the gratings which gives the following:

$$A_+ = K(OV+d)$$

$$A_- = K(OV-d)$$

The factor K is process dependent can be eliminated to give:

$$OV = d\frac{A_+ + A_-}{A_+ - A_-}$$

The overlay error can then be used to determine the error in the spaces.

Although the embodiments describe removal of the features, the features could instead be amended.

By removing or amending features, after they have been formed rather than changing the original mask pattern cross talk is limited.

The two embodiments described are not mutually exclusive and some features could be removed by removing portions of resist before etching the substrate (as in the first embodiment) and some features could be removed by using the second embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    forming a first pattern having sacrificial portions and spacers on a substrate,
        wherein the pattern comprises a plurality of first and second sections, and
        wherein the spacers are located on first and second sides of the sacrificial portions;
    amending the pattern, wherein the amending comprises:
        a first modifying of the spacers, wherein the first modifying comprises:
            removing the spacers on the first sides of the sacrificial portions in the first sections, and
            removing the spacers on the second sides of the sacrificial portions in the second sections, and
        a second modifying of the sacrificial portions;
    transferring the amended pattern to the substrate;
    projecting a beam of radiation onto the transferred pattern; and
    measuring the intensity distribution of the reflected radiation beam in order to determine a characteristic of the transferred pattern.

2. The method of claim 1, wherein the second modifying comprises removing the sacrificial portions of the pattern by exposing the sacrificial portions to radiation.

3. The method of claim 1, wherein the second modifying comprises removing every nth sacrificial portion of the pattern by exposing every nth sacrificial portion to radiation, wherein n is an integer greater than 1.

4. The method of claim 1, wherein the first modifying further comprises removing the spacers on the first and second sides of the sacrificial portions in an area that is present between each first and second sections of the plurality of first and second sections.

5. The method of claim 1, further comprising:
    forming a second pattern having sacrificial portions and spacers on the substrate,
        wherein the spacers are located on first and second sides of the sacrificial portions, and
        wherein the second pattern comprises a plurality of third and fourth sections;
    removing the spacers on the first sides of the sacrificial portions in the third sections;
    removing the spacers on the second sides of the sacrificial portions in the fourth sections; and
    removing the spacers on the first and second sides of the sacrificial portions in an area that is present between each third and fourth sections of the plurality of third and fourth sections.

6. The method of claim 5, wherein a bias in the first pattern is greater or less than a bias in the second pattern.

7. The method of claim 1, wherein the characteristic is a critical dimension of a feature of the transferred pattern.

8. The method of claim 1, wherein the characteristic is a line thickness of the feature of the transferred pattern.

9. The method of claim 1, wherein the characteristic is a distance between features of the transferred pattern.

10. The method of claim 1, wherein the transferring comprises etching the amended pattern into the substrate.

11. A method comprising:
    patterning a pattern on a substrate, wherein the pattern comprises sacrificial templates with spacers on first and second sides of the sacrificial templates;
    modifying the spacers to generate a modified pattern on the substrate, wherein the modifying comprises:
        removing the spacers on the first sides of the sacrificial templates in a first section of the pattern, and removing the spacers on the second sides of the sacrificial templates in a second section of the pattern; and transferring the modified pattern to the substrate.

12. The method of claim 11, further comprising:

projecting a beam of radiation onto the transferred pattern; and measuring an intensity distribution of the reflected radiation beam from the transferred pattern.

* * * * *